United States Patent
Lu et al.

(10) Patent No.: US 10,854,575 B2
(45) Date of Patent: Dec. 1, 2020

(54) THREE-DIMENSIONAL (3D) PACKAGE STRUCTURE HAVING AN EPOXY MOLDING COMPOUND LAYER BETWEEN A DISCRETE INDUCTOR AND AN ENCAPSULATING CONNECTING STRUCTURE

(71) Applicant: CYNTEC CO., LTD., Hsinchu (TW)

(72) Inventors: Bau-Ru Lu, Changhua County (TW); Ming-Chia Wu, Hsinchu (TW); Shao Wei Lu, Hsinchu County (TW)

(73) Assignee: CYNTEC CO., LTD., Hsinchu (TW)

(*) Notice: Subject to any disclaimer, the term of this patent is extended or adjusted under 35 U.S.C. 154(b) by 0 days.

(21) Appl. No.: 15/961,865

(22) Filed: Apr. 24, 2018

(65) Prior Publication Data

US 2018/0240781 A1    Aug. 23, 2018

Related U.S. Application Data

(63) Continuation of application No. 14/536,699, filed on Nov. 10, 2014, now Pat. No. 9,984,996.
(Continued)

(51) Int. Cl.
*H01L 25/065* (2006.01)
*H01L 23/552* (2006.01)
(Continued)

(52) U.S. Cl.
CPC .......... *H01L 25/0655* (2013.01); *H01L 23/13* (2013.01); *H01L 23/3121* (2013.01);
(Continued)

(58) Field of Classification Search
CPC ............ H01L 25/0652; H01L 25/0657; H01L 25/071; H01L 25/074; H01L 25/112; H01L 25/117; H01L 25/16; H01L 28/10; H01L 2924/1206; H01L 2924/19042; H01L 23/645; H01L 25/50; H01L 23/5389; H01L 2224/24265
See application file for complete search history.

(56) References Cited

U.S. PATENT DOCUMENTS

2008/0029907 A1* 2/2008 Koduri .................. H01F 17/045
                                                         257/784
2008/0180921 A1* 7/2008 Chen ..................... H01L 23/495
                                                         361/729
(Continued)

*Primary Examiner* — Younes Boulghassoul
(74) *Attorney, Agent, or Firm* — Min-Lee Teng; Litron Patent & Trademark Office

(57) ABSTRACT

The present invention discloses a three-dimensional package structure which can achieve a relatively high utilization of an internal space thereof, so that a size of electronic package structure can be reduced. The three-dimensional package structure comprises a first electronic component, a plurality of second electronic components and a plurality of conductive patterns. The first electronic component has a top surface and a bottom surface. The plurality of second electronic components are disposed over the top surface of the first electronic component. The plurality of conductive patterns are disposed over the plurality of second electronic components to electrically connect the plurality of second electronic components and the first electronic component.

8 Claims, 13 Drawing Sheets

Related U.S. Application Data

(60) Provisional application No. 61/918,684, filed on Dec. 20, 2013.

(51) Int. Cl.

| | | |
|---|---|---|
| *H01L 23/13* | (2006.01) | |
| *H01L 23/538* | (2006.01) | |
| *H01L 23/31* | (2006.01) | |
| *H01L 25/11* | (2006.01) | |
| *H01L 25/07* | (2006.01) | |
| *H01L 25/00* | (2006.01) | |
| *H01L 23/36* | (2006.01) | |
| *H01L 23/373* | (2006.01) | |
| *H01L 23/40* | (2006.01) | |
| *H01L 23/498* | (2006.01) | |
| *H01L 23/00* | (2006.01) | |
| *H05K 5/02* | (2006.01) | |
| *H05K 5/06* | (2006.01) | |
| *H05K 1/11* | (2006.01) | |
| *H05K 3/42* | (2006.01) | |
| *H05K 7/02* | (2006.01) | |
| *H05K 7/20* | (2006.01) | |

(52) U.S. Cl.
CPC .......... *H01L 23/36* (2013.01); *H01L 23/3735* (2013.01); *H01L 23/4006* (2013.01); *H01L 23/49811* (2013.01); *H01L 23/5389* (2013.01); *H01L 23/552* (2013.01); *H01L 24/18* (2013.01); *H01L 25/50* (2013.01); *H05K 1/115* (2013.01); *H05K 3/42* (2013.01); *H05K 5/0247* (2013.01); *H05K 5/065* (2013.01); *H05K 7/02* (2013.01); *H05K 7/20509* (2013.01); *H01L 25/072* (2013.01); *H01L 25/117* (2013.01); *H01L 2224/45124* (2013.01); *H01L 2224/45147* (2013.01); *H01L 2224/48091* (2013.01); *H01L 2224/48137* (2013.01); *H01L 2924/13055* (2013.01); *H01L 2924/13091* (2013.01); *Y10T 29/49117* (2015.01); *Y10T 29/49155* (2015.01); *Y10T 29/49165* (2015.01)

(56) References Cited

U.S. PATENT DOCUMENTS

| | | | | |
|---|---|---|---|---|
| 2008/0303125 | A1* | 12/2008 | Chen | H01L 23/495 257/676 |
| 2008/0309442 | A1* | 12/2008 | Hebert | H01F 27/292 336/65 |
| 2009/0207574 | A1* | 8/2009 | Chen | H05K 1/181 361/761 |
| 2010/0087036 | A1* | 4/2010 | Lotfi | H01L 23/49541 438/122 |
| 2010/0289609 | A1* | 11/2010 | Liao | B22F 3/12 336/221 |
| 2011/0134613 | A1* | 6/2011 | Moussaoui | H01L 23/3107 361/737 |
| 2011/0182039 | A1* | 7/2011 | Kato | H01L 23/49822 361/736 |
| 2011/0228507 | A1* | 9/2011 | Yin | H01L 23/495 361/811 |
| 2012/0014079 | A1* | 1/2012 | Chen | H05K 1/181 361/782 |
| 2012/0019343 | A1* | 1/2012 | Hsieh | H01F 17/0013 336/192 |
| 2012/0069529 | A1* | 3/2012 | Chen | H01L 23/552 361/729 |
| 2012/0236519 | A1* | 9/2012 | Chen | H05K 1/181 361/752 |
| 2013/0001756 | A1* | 1/2013 | Chen | H01L 23/495 257/666 |
| 2017/0338171 | A1* | 11/2017 | Cho | H01L 23/49537 |

* cited by examiner

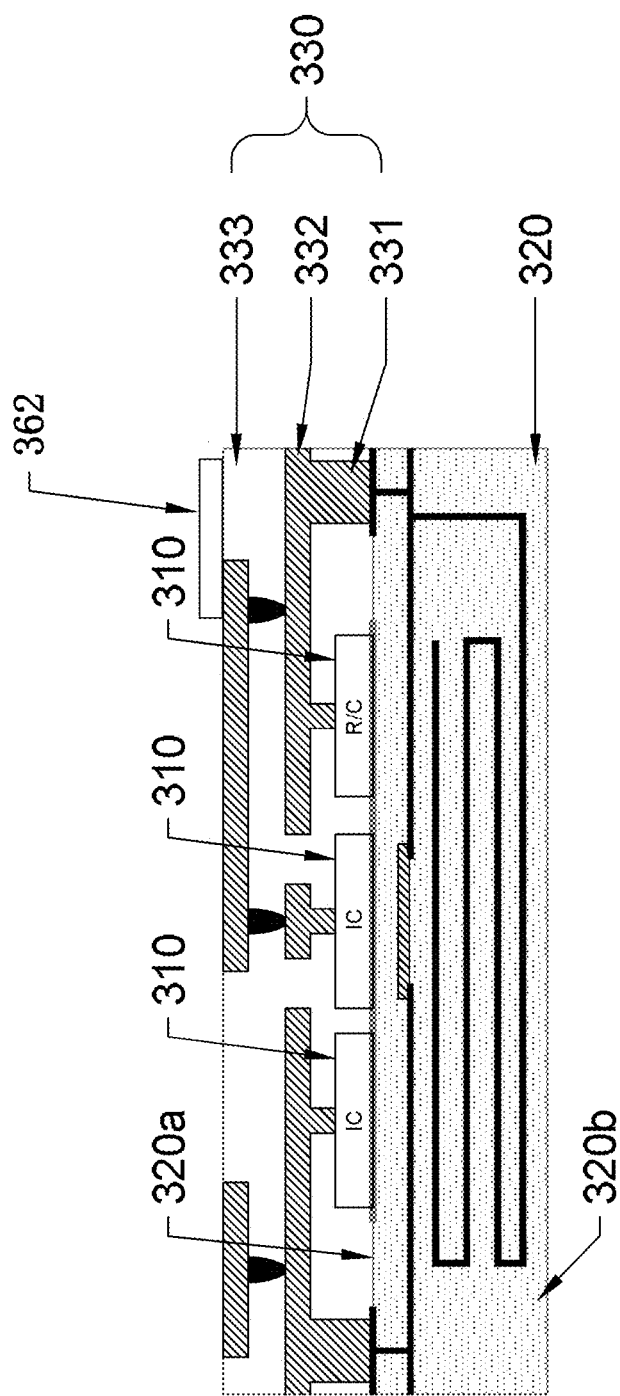

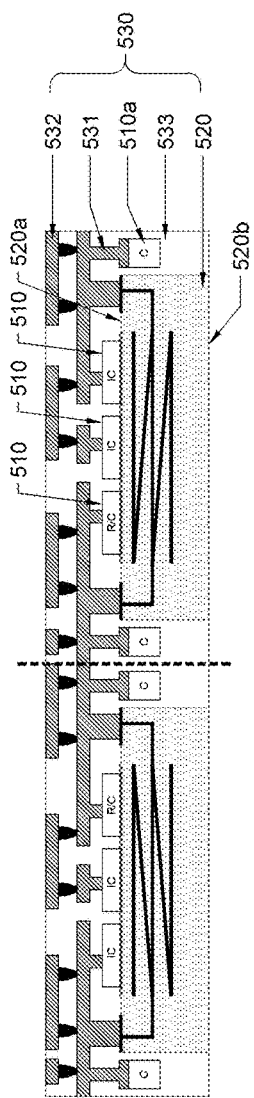

THREE-DIMENSIONAL (3D) PACKAGE STRUCTURE HAVING AN EPOXY MOLDING COMPOUND LAYER BETWEEN A DISCRETE INDUCTOR AND AN ENCAPSULATING CONNECTING STRUCTURE

CROSS-REFERENCES TO RELATED APPLICATIONS

This application is a continuation of patent application Ser. No. 14/536,699 filed on Nov. 10, 2014, which claims the benefit of U.S. Provisional Patent Application No. 61/918,684 filed on Dec. 20, 2013, each of which is hereby incorporated by reference herein and made a part of specification.

BACKGROUND OF THE INVENTION

I. Field of the Invention

The present invention relates to a package structure, and in particular, to a three-dimensional package structure.

II. Description of the Prior Art

Electronic package structures are formed by complicated package processes.

Different electronic package structures have different electrical performances and capacities of heat dissipation, and therefore a designer may select an electronic package structure with a desired electrical performance and capacity of heat dissipation according to a design requirement.

FIG. 1 is a schematic diagram of a conventional electronic package structure. Referring to FIG. 1, the conventional electronic package structure 100 includes a printed circuit board (PCB) 110 and a plurality of electronic elements 120. The electronic elements 120 are disposed on a surface 112 of the PCB 110 and electrically connected to the PCB 110. The PCB 110 has a plurality of pins 116 extending out from another surface 114 of the PCB 110 to be electrically connected to an electronic device, for example, a motherboard (not shown).

FIG. 2 is a schematic diagram of another conventional electronic package structure. Referring to FIG. 2, the conventional electronic package structure 200 includes a circuit substrate 210 and a plurality of electronic elements 220. The electronic elements 220 are disposed on a surface 212 of the circuit substrate 210, and electrically connected to the circuit substrate 210 via a wire bonding technology, a flip-chip bonding technology or a surface mount technology. Moreover, the conventional electronic package structure 200 may be electrically connected to an electronic device, for example, a motherboard (not shown), via a solder paste or a plurality of solder balls (not shown).

It should be noted that the electronic elements 120 of the conventional electronic package structure 100 are all disposed on the surface 112 of the PCB 110, and the electronic elements 220 of the conventional electronic package structure 200 are all disposed on the surface 212 of the circuit substrate 210. Therefore, in the conventional electronic package structures 100 and 200, spatial utilization of the PCB 110 and the circuit substrate 210 is relatively low, and the sizes of the conventional electronic package structures 100 and 200 are relatively large.

Conventionally, SIP (Single Inline Package), LGA (Land Grid Array) and BGA (Ball Grid Array) are widely used in package structures, such as the package structures of power element/modules like DC/DC converter for PC, Notebook, Servo . . . , etc. However, SIP requires soldering, large area and manual disposing; LGA and BGA require soldering for the electrical connections of internal elements. Therefore, such kinds of packaging have many disadvantages including: higher costs (large area and/or manually disposing, soldering), lower reliability (solder melting), and poor heat dissipation.

Accordingly, the present invention proposes a package structure and its manufacturing method to overcome the above-mentioned disadvantages.

SUMMARY OF THE INVENTION

One objective of the present invention is to provide a three-dimensional package structure to reduce the size of an electronic module.

In one embodiment, a three-dimensional package structure is disclosed, the three-dimensional package structure comprising: a first electronic component having a top surface and a bottom surface; a plurality of second electronic components, disposed over the top surface of the first electronic component; a connecting structure disposed over the top surface of the first electronic component for encapsulating the plurality of second electronic components, the connecting structure comprising at least one insulating layer and a plurality of conductive patterns separated by the at least one insulating layer, wherein the plurality of conductive patterns are disposed over the plurality of the second electronic components for electrically connecting the plurality of second electronic components and the first electronic component.

In one embodiment, an insulating layer is disposed on the first electronic component so as to form a substantially horizontal surface over the second electronic components, wherein said a plurality of conductive patterns is disposed on the substantially horizontal surface. In one embodiment, at least one terminal of the second electronic components is disposed on the substantially horizontal surface.

In one embodiment, the top surface of the first electronic component comprises a cavity, wherein at least one of the plurality of second electronic components is disposed in the cavity. Therefore the space in the three-dimensional package structure can be used more efficiently compared with the conventional electronic package structures.

In one embodiment, the plurality of second electronic components comprises at least one of capacitor, resistor, diode, MOSFET, a bare die, and an IC.

In one embodiment, the first electronic component can be a discrete electronic component; the discrete electronic component can be an inductor or any other electronic component (e.g., capacitor); the inductor can be an LTCC (Low Temperature Co-fired Ceramics) inductor.

In one embodiment, the plurality of second electronic components comprises at least one power module.

In one embodiment, further comprising at least one second electronic components disposed aside the first electronic component.

In one embodiment of the present invention, the plurality of conductive patterns further comprises a shielding layer.

In one embodiment, the at least one insulating layer comprises an ABF (Ajinomoto Build-up Film).

In one embodiment, an EMC (Epoxy Molding Compound) is disposed on the top surface of the first electronic component, wherein the plurality of second electronic components and at least one of the plurality of conductive patterns are disposed on the EMC layer.

In one embodiment, the plurality of conductive patterns is made by lithographic thin film process.

In one embodiment of the present invention is to provide a method of manufacturing a three-dimensional package structure. The method comprises the steps of: (a) providing a first electronic component having a top surface and a bottom surface; (b) disposing a plurality of second electronic components over the top surface of the first electronic component; and (c) forming a plurality of conductive patterns over the plurality of the second electronic components to electrically connect the plurality of second electronic components and the first electronic component.

In one embodiment of the present invention is to provide a method of manufacturing a plurality of three-dimensional packaging module, the method comprising the steps of: (a) providing a plurality of first electronic components on a carrier, wherein each of the plurality of first electronic components has a top surface and a bottom surface; (b) disposing a plurality of second electronic components over the top surface of each of the plurality of the first electronic components; (c) forming a plurality of conductive patterns over the plurality of second electronic components on each of the plurality of first electronic component to electrically connect the plurality of second electronic components and the first electronic component; and (d) forming the plurality of the three-dimensional packaging module, wherein each three-dimensional packaging module comprises a corresponding first electronic component and the plurality of the second electronic components disposed on the corresponding first electronic component, respectively.

The detailed technology and above preferred embodiments implemented for the present invention are described in the following paragraphs accompanying the appended drawings for people skilled in the art to well appreciate the features of the claimed invention.

BRIEF DESCRIPTION OF THE DRAWINGS

The foregoing aspects and many of the accompanying advantages of this invention will become more readily appreciated as the same becomes better understood by reference to the following detailed description when taken in conjunction with the accompanying drawings, wherein:

FIG. 3a and FIG. 3b illustrate a schematic diagram of a three-dimensional package structure according to a first embodiment of the present invention.

FIG. 5a to FIG. 5c illustrate the method and manufacturing process for a three-dimensional package structure according to a second embodiment of the present invention.

DETAILED DESCRIPTION OF THE INVENTION

The detailed explanation of the present invention is described as follows. The described preferred embodiments are presented for purposes of illustrations and description, and they are not intended to limit the scope of the present invention.

The following embodiments disclose a three-dimensional packaging module and a method for manufacturing the three-dimensional packaging module. A three-dimensional packaging means a packaging structure on which conductive elements are constructed not only in plane but also stacked in height to improve the spatial efficiency.

First Embodiment

In one embodiment of the present invention, a three-dimensional package structure is disclosed, three-dimensional package structure comprising: a first electronic component having a top surface and a bottom surface; a plurality of second electronic components, disposed over the top surface of the first electronic component; a connecting structure disposed over the top surface of the first electronic component for encapsulating the plurality of second electronic components, the connecting structure comprising at least one insulating layer and a plurality of conductive patterns separated by the at least one insulating layer, wherein the plurality of conductive patterns are disposed over the plurality of second electronic components for electrically connecting the plurality of second electronic components and the first electronic component.

Figure 1:
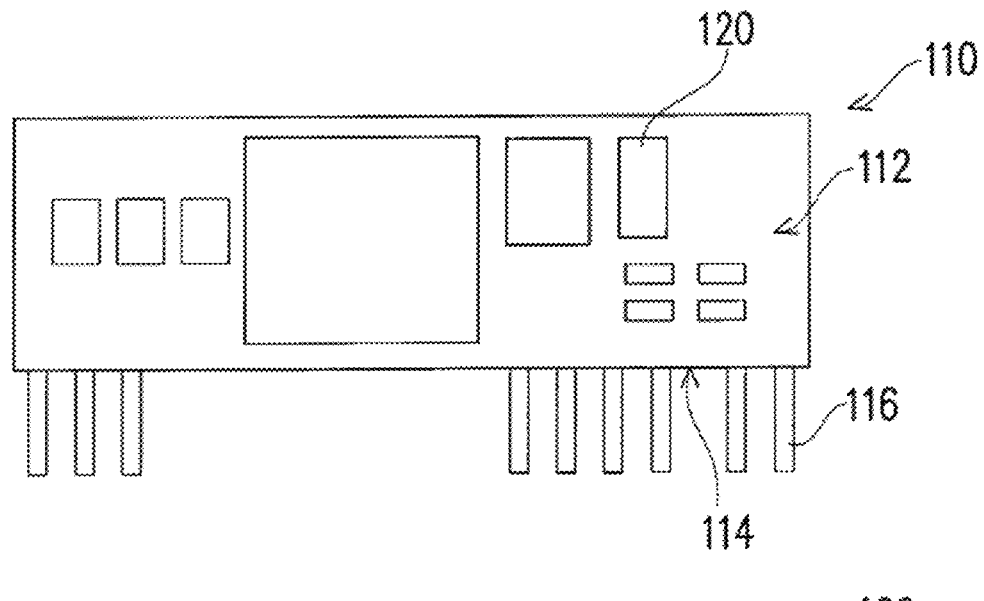
FIG. 1 is a schematic diagram of a conventional electronic package structure.
Figure 2:
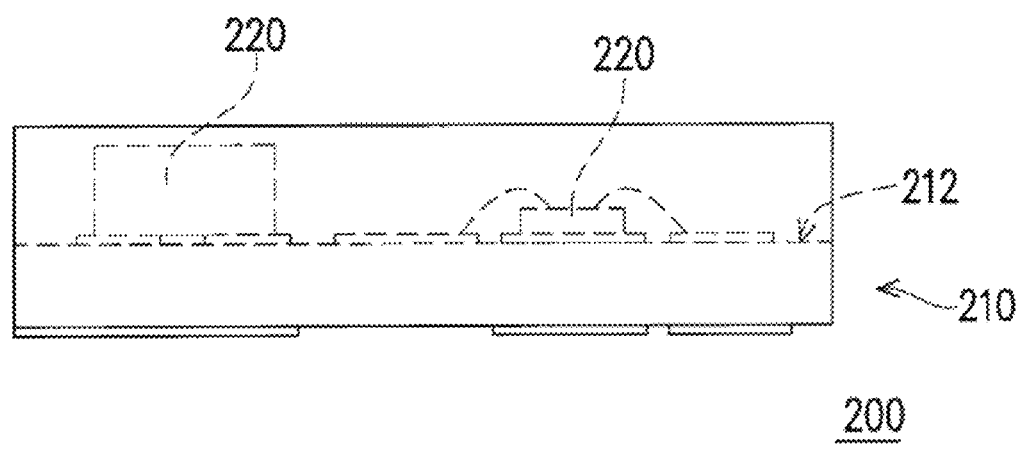
FIG. 2 is a schematic diagram of another conventional electronic package structure.
Figure 3B:
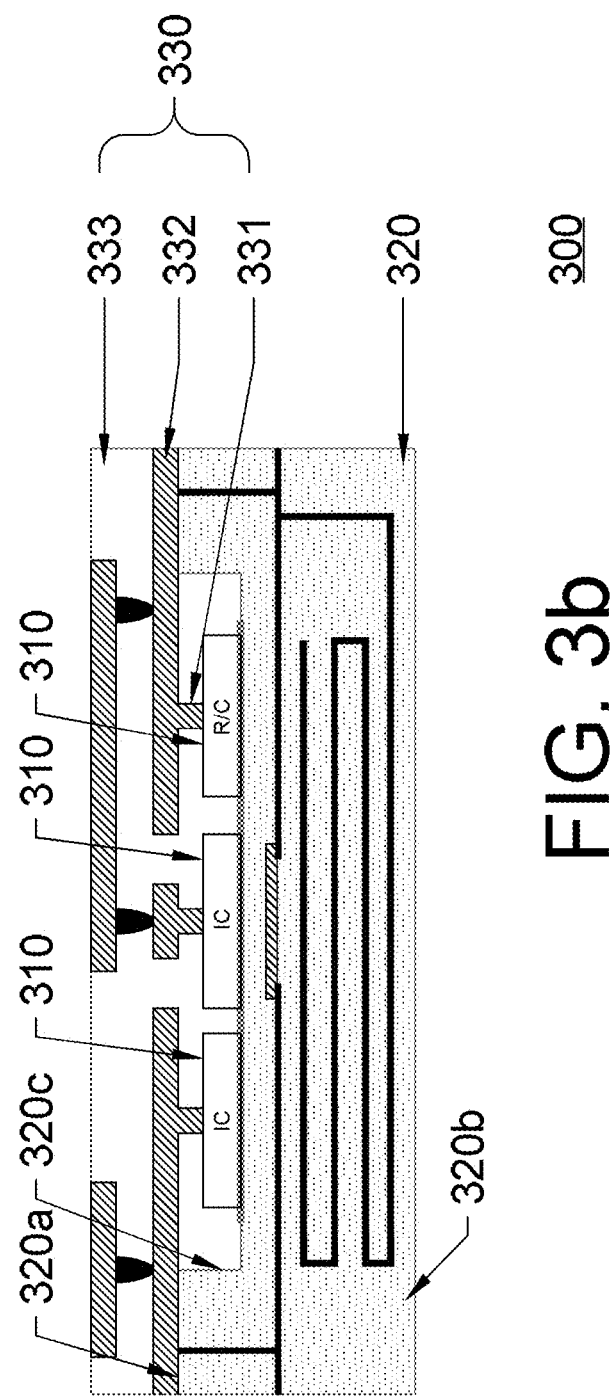

FIG. 3a and FIG. 3b show the schematic diagrams of a three-dimensional package structure according to a first embodiment of the present invention. Referring to FIG. 3a and FIG. 3b, a three-dimensional package structure 300 includes a connecting structure 330 disposed over the top surface of a first electronic component 320 for encapsulating the plurality of second electronic components 310; the first electronic component 320 has a top surface 320a and a bottom surface 320b; the plurality of second electronic components 310 (three electronic components are illustrated in FIG. 3a and FIG. 3b) disposed over the top surface 320a of the first electronic component 320; a plurality of conductive patterns, such as the plurality of via holes 331 and wire layer 332, are disposed over the plurality of second electronic components 310 to electrically connect the plurality of second electronic components 310 and the first electronic component 320. In one embodiment, at least two of the plurality of second electronic components 310 are electrically connected through the plurality of conductive patterns, such as the plurality of via holes 331 and wire layer 332. In other words, the connecting structure 330 is disposed over the top surface of the first electronic component to encapsulate the plurality of second electronic components, wherein the connecting structure 330 comprises conductive patterns, such as the plurality of via holes 331 and wire layer 332, to electrically connect the plurality of second electronic components 310 and the first electronic component 320, wherein at least one insulating layer, such as ABF (Ajinomoto Build-up Film) 333, is used to separate the plurality of conductive patterns. In one embodiment, the ABF (Ajinomoto Build-up Film) 333 is attached to the top surface of the first electronic component 320 by pressing to encapsulate the plurality of second electronic components 310. Please note that other insulating materials can be used instead of the ABF (Ajinomoto Build-up Film) 333, and different layers may contain different insulating materials.

The conductive patterns can be formed by any suitable patterning process (e.g., lithography process). The conductive patterns can include some pads on the top surface of the connecting structure for connecting to other circuits. The conductive patterns connect at least one terminal of the second electronic components 310 to a pad 362 on the top surface of the three-dimensional package structure 300 for connecting to an external circuit, such as a PCB board. In one embodiment, one or more terminals of each of the second electronic components 310 are disposed on the top surface of the corresponding electronic component. In other words, all or a portion of the terminals of each second electronic components 310 faces the PCB board.

In one embodiment, an insulating layer is disposed on the first electronic component 320 so as to form a substantially horizontal surface over the second electronic components 310, wherein the conductive patterns are disposed on the substantially horizontal surface.

The projecting area on the circuit substrate of the second electronic components 310 can be smaller than that of the first electronic component 320 for convenience to apply patterning process over the second electronic components 310. Preferably, at least one terminal of the first electronic component 320 and at least one terminal of the second electronic components 310 face the circuit substrate and are electrically connected to the circuit substrate through the conductive patterns formed when at least one terminal of the second electronic components 310 face up (at least one terminal of the first electronic component 320 may face up).

For better configuration of at least one terminal of the first electronic component 320 and the second electronic components 310 on the top surface 320a of the first electronic component 320, the second electronic components 310 are disposed on the center of the top surface 320a of the first electronic component 320, and at least one terminal of the first electronic component 320 is disposed on the periphery of the top surface 320a of the first electronic component 320. In one embodiment, the first electronic component 320 can have a first terminal (not shown) and a second terminal (not shown); the first terminal is disposed on a first edge of the top surface 320a and the second terminal is disposed on a second edge of the top surface 320a opposite to the first edge.

The first electronic component 320 may comprise a cavity (not shown) therein, and the second electronic components 310 can be disposed in the cavity to further decrease the height of the three-dimensional package structure. There are many different ways to locate the cavity: in one embodiment, the cavity is formed inside the first electronic component 320; in another embodiment, the cavity is formed with one side aligned with one edge of the first electronic component 320; in yet another embodiment, the cavity is formed with two sides aligned with two edges of the first electronic component 320 respectively.

For better configuration of at least one terminal of the first electronic component 320 and the second electronic components 310 on the top surface 320a of the first electronic component 320, the cavity is disposed in the center of the top surface 320a of the first electronic component 320, the second electronic components 310 are disposed in the cavity, and at least one terminal of the first electronic component 310 is disposed around the cavity. In one embodiment, the first electronic component 320 can have a first terminal (not shown) and a second terminal (not shown); the first terminal is disposed on a first side of the cavity and the second terminal is disposed on a second side of the cavity opposite to the first side.

Figure 3C:
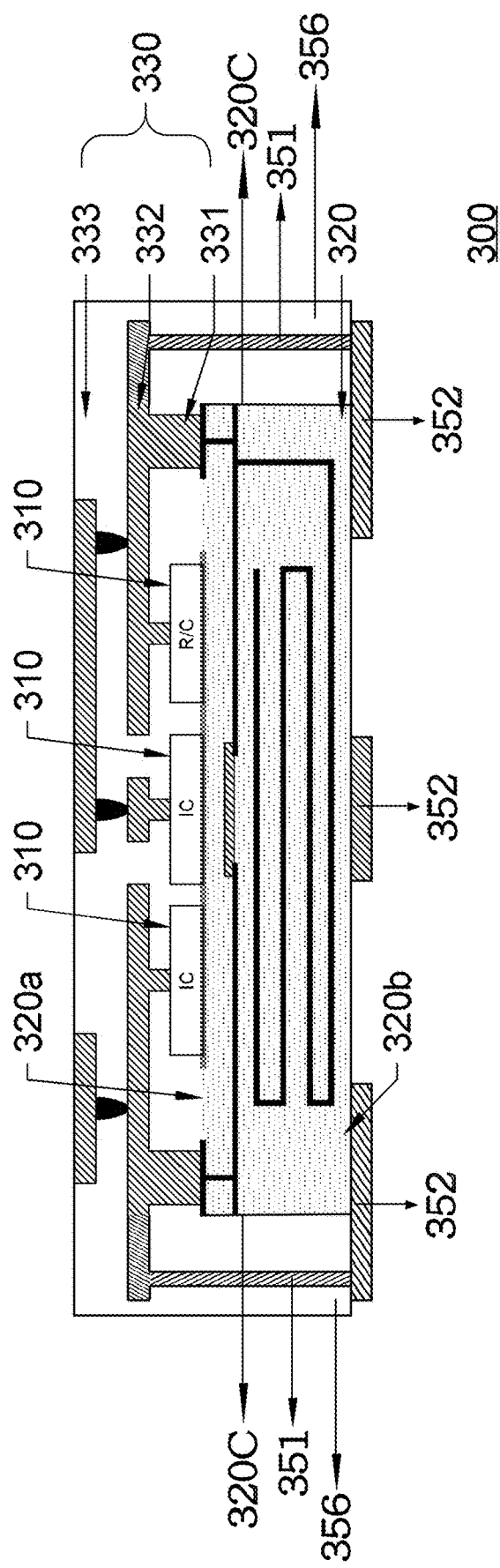
FIG. 3c to FIG. 3e illustrate a schematic diagram of another three-dimensional package structure.
Figure 3D:
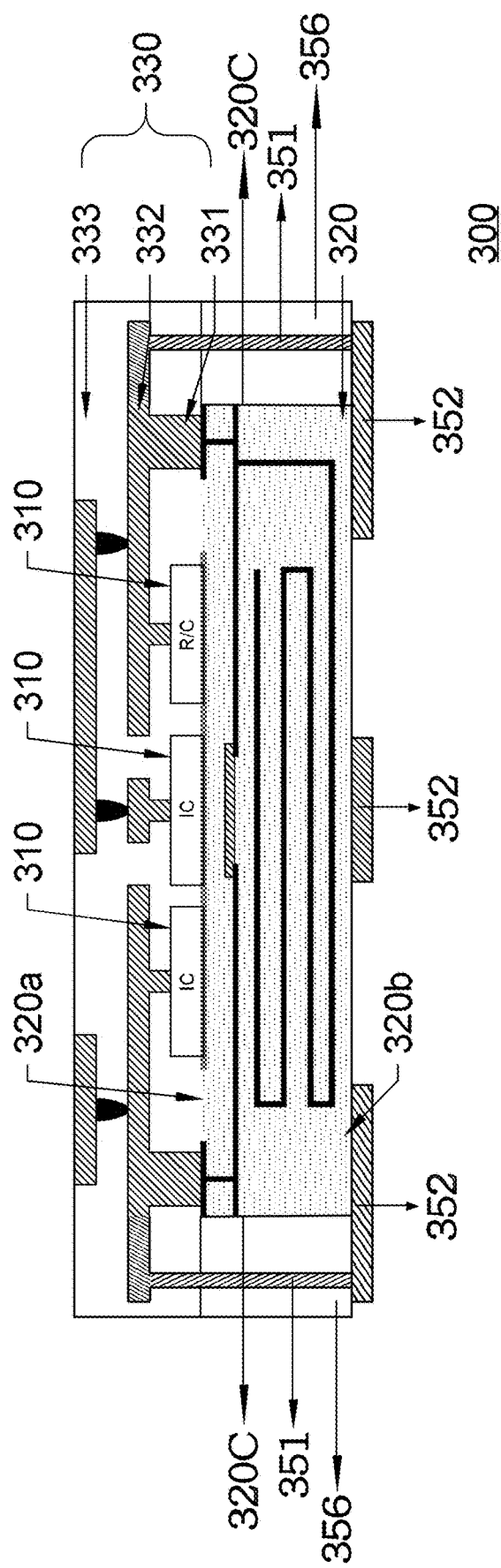
Figure 3E:
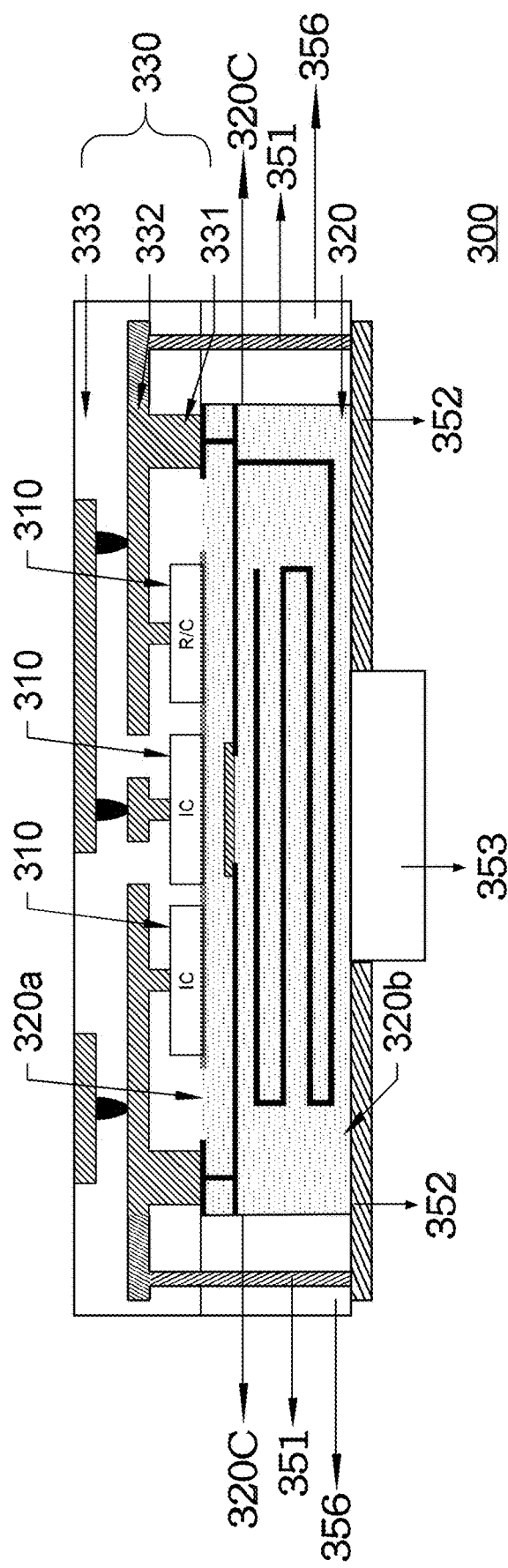

FIG. 3c to FIG. 3e illustrate a schematic diagram of another three-dimensional package structure. The conductive patterns can be extended to the bottom surface 320b of the first electronic component 320 through a plurality of through vias 351 aside the lateral surface 320c of the first electronic component 320 to form a plurality of pads 352 disposed on the bottom surface 320b of the first electronic component 320 or to be electrically connected to a third electronic component 353 disposed on the bottom surface 320b of the first electronic component 320. The through vias 351 can be formed in the first insulating material 356 aside the lateral surface 320c of the first electronic component 320. In one embodiment, the first insulating material 356 can be the same as the second insulating material 333 separating the conductive patterns. Preferably, the first insulating material 356 and the second insulating material 333 can be made of ABF (Ajinomoto Build-up Film). In one embodiment, the first insulating material 356 can be different from the second insulating material 333 separating the conductive patterns. Optionally, the boundary of the first insulating material 356 and the second insulating material 333 can align the top surface 320a of the first electronic component 320, but it is not limited to this case. Preferably, the first insulating material 356 can be made of EMC (Epoxy Molding Compound) and the second insulating material 333 can be made of ABF (Ajinomoto Build-up Film).

The three-dimensional package structure 300 is generally applied to a voltage regulator module, a power module, a network adapter, a graphics processing unit, a DC/DC converter or a point-of-load (POL) converter. The first electronic component 320 can be a discrete electronic component. The discrete electronic component can be an inductor or any other electronic component (e.g., capacitor). The inductor can be an LTCC (Low Temperature Co-fired Ceramics) type inductor or any other kind of inductor. As shown in FIG. 3b, the top surface 320a of the first electronic component 320 can further comprise a cavity 320c, and at least one of the plurality of second electronic components 310 is disposed in the cavity 320c to improve the spatial efficiency.

Each of the second electronic components 310 can be a logical control element, a driving element or a passive element. The passive element can be a capacitor, an inductor with lesser inductance, or a resistor. Each of the second electronic components 310 can also be a power element, such as a metal-oxide-semiconductor field effect transistor (MOSFET), an insulated gate bipolar transistor (IGBT), a bare die, an IC or a diode.

The plurality of conductive patterns can be formed by thin film technology such as photolithography, sputtering, electroplating or chemical vapor deposition process. The plurality of conductive patterns can also be in multiple layers. As shown in FIG. 4, the plurality of conductive patterns includes a plurality of via holes 331 and wire layer 332. The via holes 331 and wire layer 332 of the plurality of conductive patterns can provide all required electronic connections. In one embodiment, the insulating layers uses the ABF (Ajinomoto Build-up Film) 333 to combine the first electronic component 320, the plurality of second electronic components 310 and the plurality of conductive patterns 330 as a whole body. Please note that other insulating materials can be used instead of the ABF (Ajinomoto Build-up Film) 333, and different layers may contain different insulating materials.

In other words, a connecting structure is disposed over the top surface of the first electronic component to encapsulate the plurality of second electronic components, wherein the connecting structure comprises conductive patterns, such as the plurality of via holes and wire layers, to electrically connect the plurality of second electronic components and the first electronic component and at least one insulating layer, such as the ABF (Ajinomoto Build-up Film), to separate the plurality of conductive patterns.

Figure 3F:
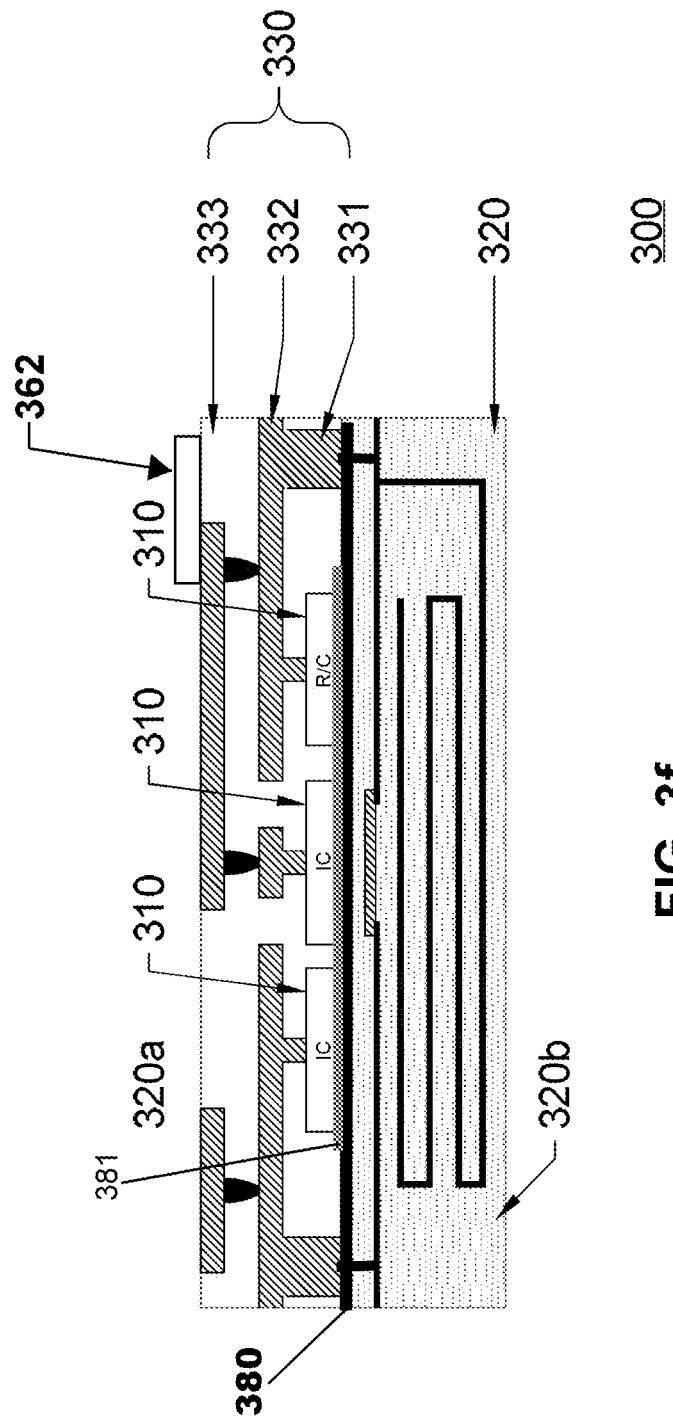
FIG. 3f illustrates a schematic diagram of another three-dimensional package structure.

In one embodiment, the three-dimensional package structure 300 further comprises a shielding layer (not shown) disposed in the connecting structure 330 for EMI-shielding. In one embodiment, as shown in FIG. 3*f*, an EMC (Epoxy Molding Compound) 380 layer is disposed on the top surface of the first electronic component 320, wherein the plurality of second electronic components 310 and some conductive patterns 381 can be disposed on the EMC layer, wherein the connecting structure 330 can be disposed on the EMC (Epoxy Molding Compound) layer 380 to encapsulate the plurality of second electronic components 310 and said some conductive patterns 381, wherein said some conductive patterns 381 can be electrically connected to the conductive patterns in the connecting structure 330. In one embodiment, at least one pad 362 can be disposed on the top surface of the connecting structure 330 for connecting to an external PCB board.

With the embodiment of the present invention, the strength and reliability for the connection of wire and components are superior to conventional soldering or wire bonding. Wiring distance can be shortened to reduce the resistance and improve efficiency; in addition, the height of the whole package structure can be further reduced.

Figure 4A:
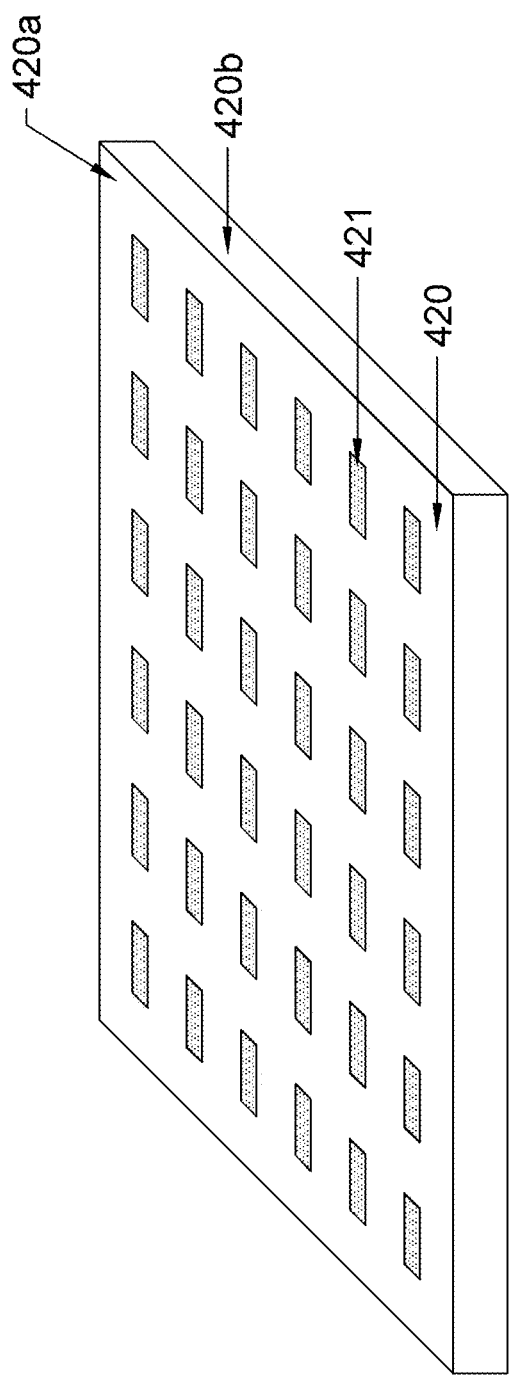
FIG. 4a to FIG. 4c illustrate the method and manufacturing process for a three-dimensional package structure according to a first embodiment of the present invention.
Figure 4B:
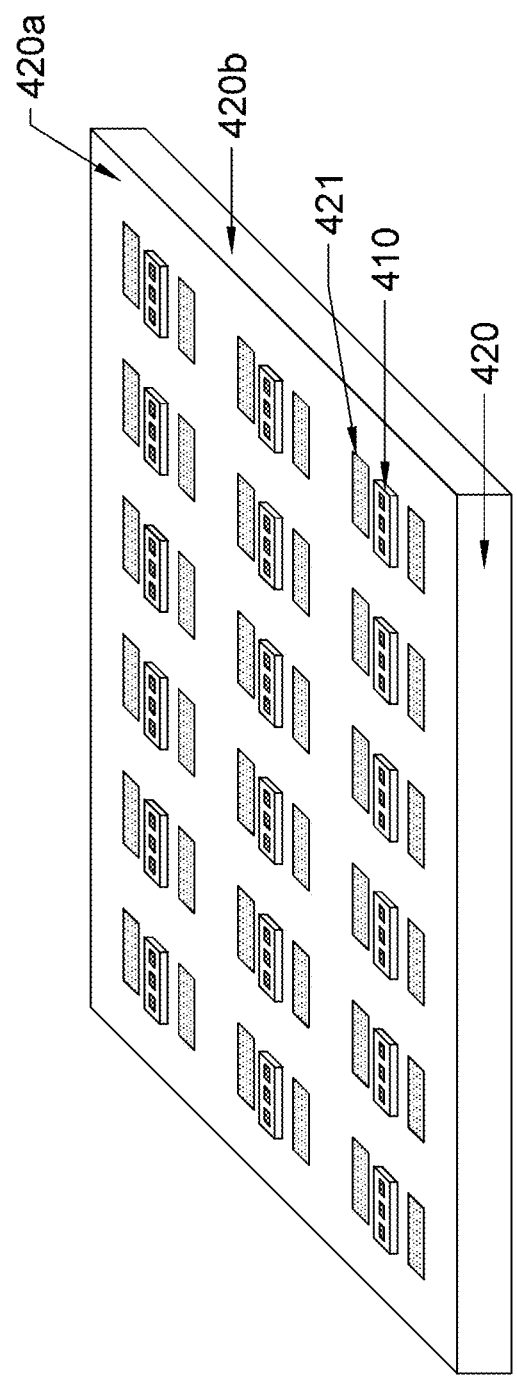
Figure 4C:
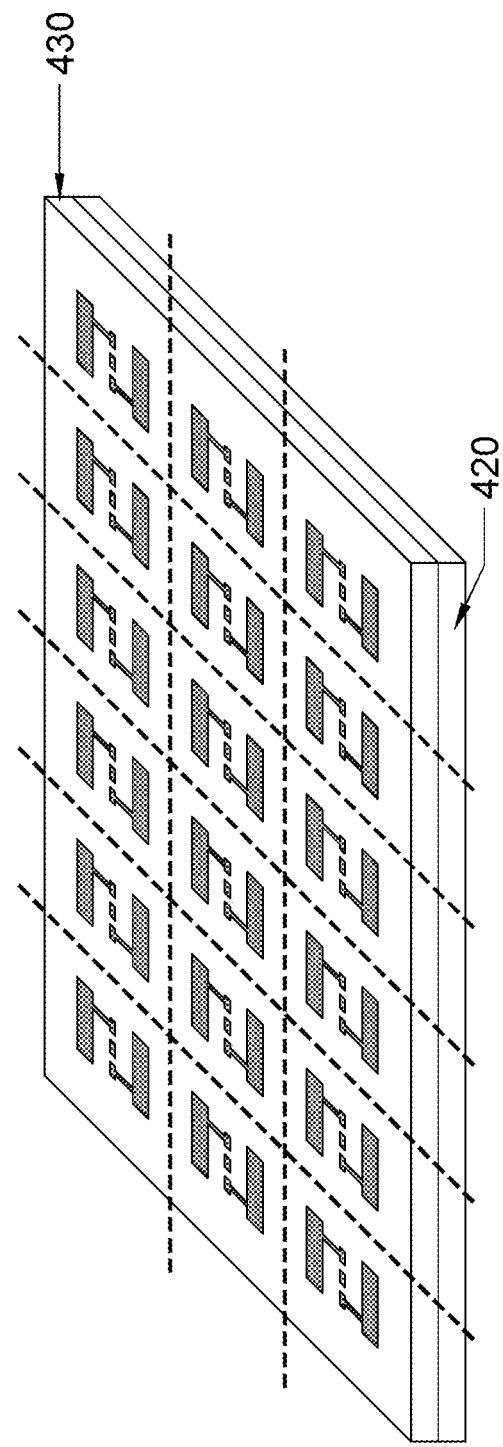

FIG. 4*a* to FIG. 4*c* illustrate the method and manufacturing process for a three-dimensional package structure according to a first embodiment of the present invention. Referring to FIG. 4*a*, it shows the step of providing a first electronic component 420 having a top surface 420*a* and a bottom surface 420*b*. The first electronic component 420 can be a discrete electronic component. The discrete electronic component can be an inductor or any other electronic component (e.g., capacitor). The inductor can be an LTCC type inductor or any other kind of inductor. The top surface 420*a* of the first electronic component 420 may expose the electrodes 421 of the first electronic component 420 for electronic connections. For mass production and cost down, a plurality of first electronic components can be provided simultaneously and arranged in a matrix by a tape (or fixture) (not shown) or an EMC (Epoxy Molding Compound) (not shown).

Referring to FIG. 4*b*, it shows the step of disposing a plurality of second electronic components 410 over the top surface 420*a* of the first electronic component 420. The first electronic component 420 may comprise of a cavity (not shown) and at least one of the plurality of second electronic components 410 can be disposed in the cavity to further decrease the height of the three-dimensional package structure. In this step, soldering, die attach film, or die bond paste can be used for the attachment/positioning of each of the plurality of second electronic components 410.

Each of the second electronic components 410 can be a logical control element, a driving element or a passive element. The passive element can be a capacitor, an inductor with lesser inductance, or a resistor. Each of the second electronic components 410 can also be a power element, such as a metal-oxide-semiconductor field effect transistor (MOSFET), an insulated gate bipolar transistor (IGBT), and IC or a diode.

Referring to FIG. 4*c*, it shows the step of disposing a plurality of conductive patterns, in a connecting structure 430, over the plurality of second electronic components 410 to electrically connect the plurality of second electronic components and the first electronic component 420.

The plurality of conductive patterns in the connecting structure 430 can be formed by thin film technology such as photolithography, sputtering, electroplating or chemical vapor deposition process. The plurality of conductive patterns in the connecting structure 430 can also be disposed in multiple layers with insulating layers of different types of materials and constructed as different functions. Laser can be used to form a plurality of via holes in the plurality of conductive patterns. The wire layers and conductive material can be disposed by an electroplating process. The via holes and wire layers of the plurality of conductive patterns can provide all the required electronic connections; the insulating layers can use the ABF to combine the first electronic component 420, the plurality of second electronic components 410 and the plurality of conductive patterns as a whole body. The plurality of conductive patterns can further include a shielding layer (not shown) for EMI-shielding. The connecting structure 430 can further include an EMC (Epoxy Molding Compound) (not shown) layer for bonding.

As shown in FIG. 4*c*, a cutting process (shown as dash lines) can be included to separate single package module from each other.

Second Embodiment

Figure 5A:
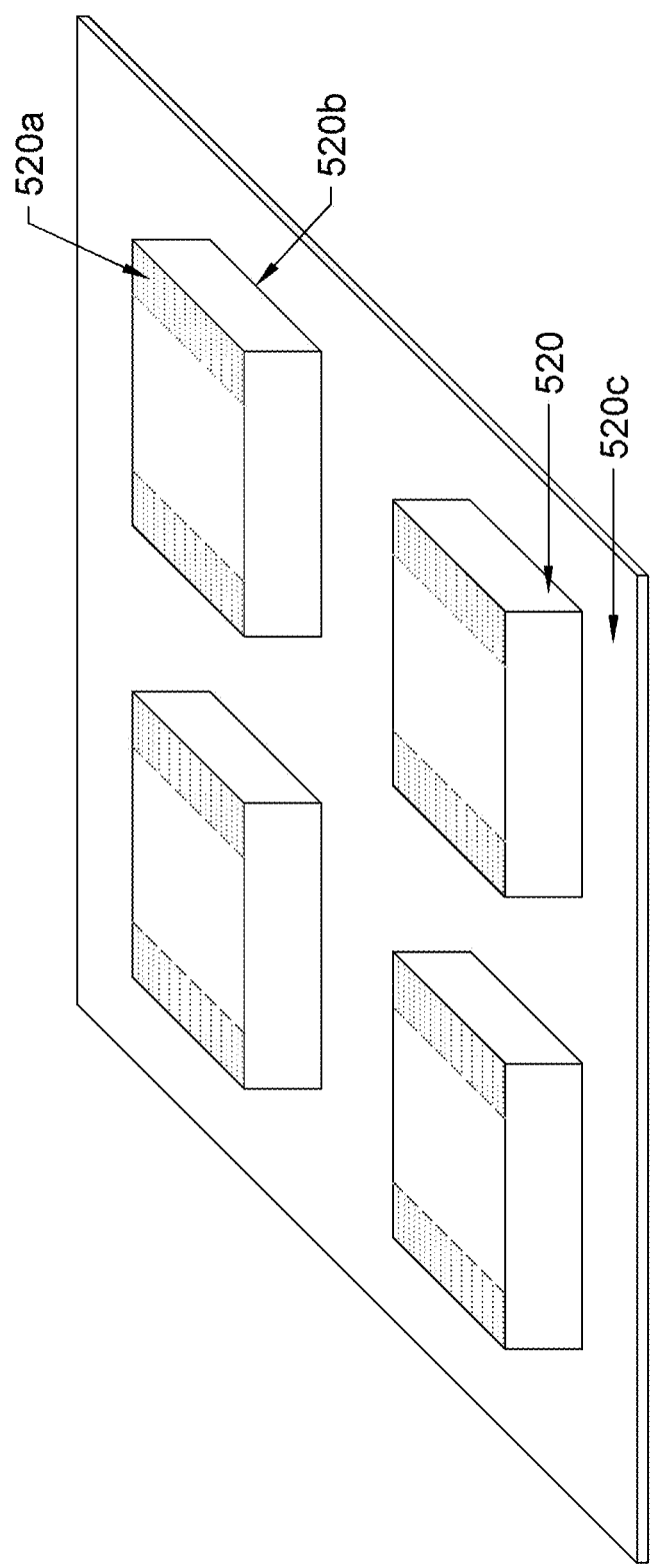
Figure 5B:
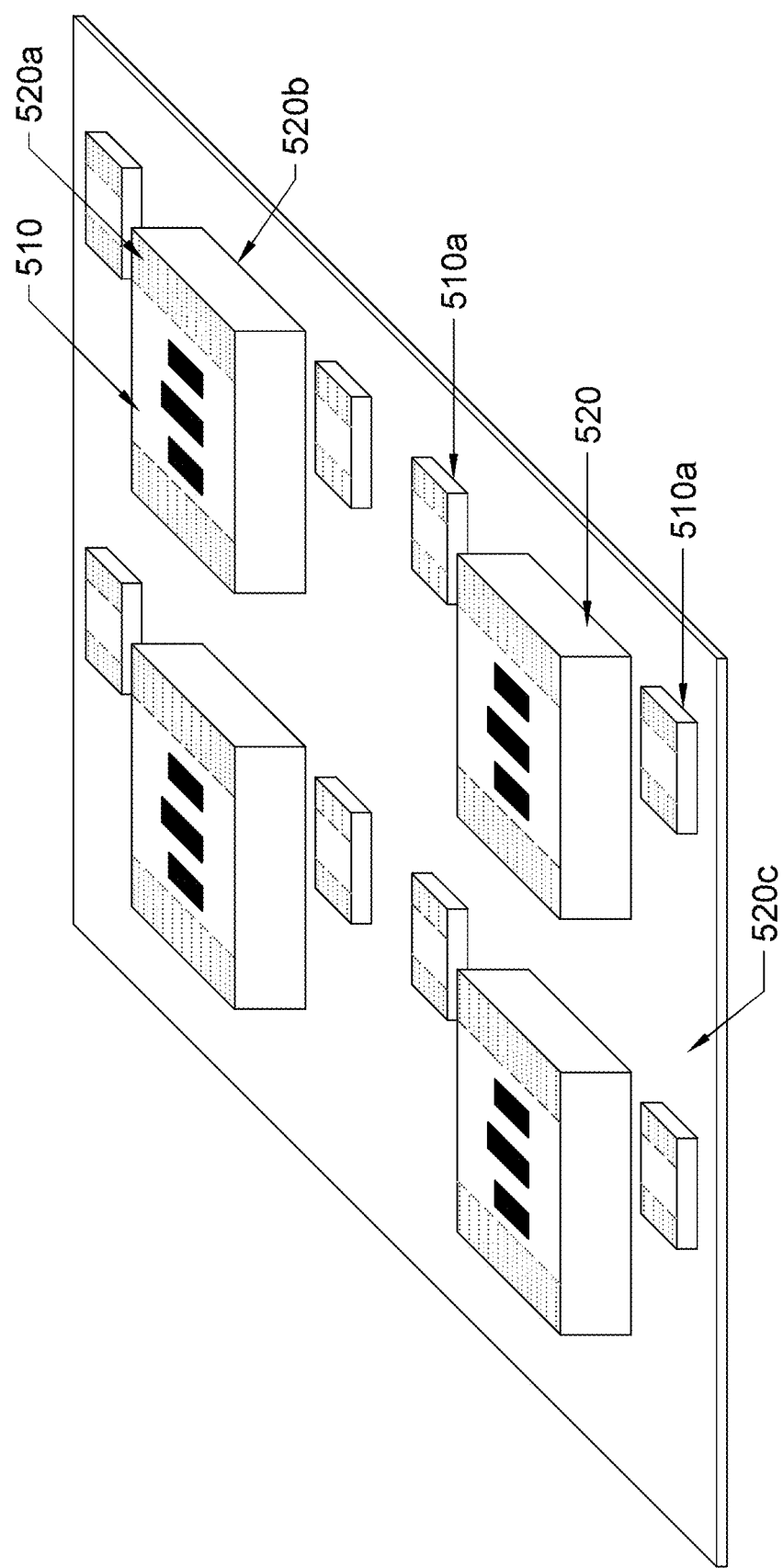

FIG. 5*a* to FIG. 5*c* illustrate the method and manufacturing process for a three-dimensional package structure according to a second embodiment of the present invention. The difference between this embodiment and the first embodiment is that each three-dimensional package structure module further includes at least one discrete electronic component 510*a* aside the first electronic component 520. The conductive patterns 530 lead at least one terminal of the discrete electronic component 510*a* to the top surface of the three-dimensional package structure for bonding to the circuit substrate. At least one terminal of the discrete electronic component 510*a* can be disposed on the top surface of the discrete electronic component 510*a*. In other words, at least one terminal of the discrete electronic component 510*a* faces the circuit substrate. Referring to FIG. 5*a*, it shows the step of providing a first electronic component 520 having a top surface 520*a* and a bottom surface 520*b*. The first electronic component 520 can be a discrete electronic component. The discrete electronic component can be an inductor or any other electronic component (e.g., capacitor). The inductor can be an LTCC type inductor or any other kind of inductor. The top surface 520*a* of the first electronic component 520 may expose the electrodes (not shown) of the first electronic component 520 for electronic connections. For mass production and cost down, a plurality of inductors can be provided simultaneously and arranged in a matrix by a tape (or fixture) 520*c* or an EMC (Epoxy Molding Compound) (not shown).

Referring to FIG. 5*b*, it shows the step of disposing a plurality of second electronic components 510 over the top surface 520*a* of the first electronic component, and disposing at least one second electronic components 510*a*, such as a capacitor, aside the first electronic component 520. The first electronic component 520 may comprise of a cavity (not shown) and at least one of the plurality of second electronic components 510 can be disposed in the cavity to further decrease the height of the three-dimensional package structure. In this step, soldering/die attach film/die bond paste can be used for the attachment/positioning of each of the plurality of second electronic components 510.

Each of the second electronic components 510, 510*a* can be a logical control element, a driving element or a passive element. The passive element can be a capacitor, an inductor with lesser inductance, or a resistor. Each of the second electronic components 510, 510a can also be a power element, such as a metal-oxide-semiconductor field effect transistor (MOSFET), an insulated gate bipolar transistor (IGBT), and IC, a bare die or a diode.

Referring to FIG. 5c, the step is to dispose a plurality of conductive patterns, in a connecting structure 530, over the plurality of discrete electronic components 510, 510a to electrically connect the plurality of discrete electronic components 510, 510a and the inductor 520.

The plurality of conductive patterns, such as a plurality of via holes 531 and wire layers 532, can be formed by thin film technology such as photolithography, sputtering, electroplating or chemical vapor deposition process. The plurality of conductive patterns can also be disposed in multiple layers. Laser can be used to form a plurality of the via holes 531. The wire layers 532 can be disposed by an electroplating process. The via holes 531 and wire layers 532 can provide all required electronic connections; insulating layers, such as the ABF 533, can combine the first electronic component 520, the plurality of second electronic components 510, 510a and the plurality of conductive patterns as a whole body. The plurality of conductive patterns can further include a shielding layer (not shown) for EMI-shielding. The connecting structure 530 can further include an EMC (Epoxy Molding Compound) (not shown) layer for bonding.

As shown in FIG. 5c, a cutting process (shown as dash lines) can be included to separate single package module from each other. In the present invention, the fabrication method is not limited to inductors, but also to inductive components.

It follows from description of the above embodiments that the structure of the present invention and the method for manufacturing the same can offer many advantages including: 1. Better performance of heat dissipation and electrical conductance. 2. Smaller size by forming the plurality of conductive patterns and using thin film technology and process, to connect all the conductive elements by a conductive pattern with extremely thin conductive patterns. 3. Lower cost, compact size and great bond strength/reliability.

The above disclosure is related to the detailed technical contents and inventive features thereof. People skilled in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A three-dimensional package structure, comprising:
a discrete inductor;
a plurality of discrete electronic components, disposed over a top surface of the discrete inductor; and
an Epoxy Molding Compound (EMC) layer, disposed on the top surface of the discrete inductor, wherein the plurality of discrete electronic components and a plurality of conductive patterns are disposed over the top surface of the EMC layer, wherein a connecting structure comprising conductive patterns is disposed on the EMC layer to encapsulate the plurality of discrete electronic components and the plurality of conductive patterns, and a first terminal of the discrete inductor is disposed on the top surface of the discrete inductor and electrically connected to a first conductive pattern disposed in the connecting structure.

2. The three-dimensional package structure according to claim 1, wherein a second terminal of the discrete inductor is disposed on the top surface of the discrete inductor and electrically connected to a second conductive pattern disposed in the connecting structure.

3. The three-dimensional package structure according to claim 2, wherein a pad is disposed on a top surface of the connecting structure.

4. The three-dimensional package structure according to claim 2, wherein the connecting structure comprises an insulating layer made of Ajinomoto Build-up Film (ABF).

5. The three-dimensional package structure according to claim 2, wherein the second terminal of the discrete inductor is electrically connected to a second conductive via disposed in the connecting structure.

6. The three-dimensional package structure according to claim 1, wherein the discrete inductor is an LTCC (Low-Temperature Co-fired Ceramics) inductor.

7. The three-dimensional package structure according to claim 1, wherein each of the plurality of discrete electronic components is a capacitor, a resistor, a diode, a transistor, a bare die or an IC.

8. The three-dimensional package structure according to claim 1, wherein the first terminal of the discrete inductor is electrically connected to a first conductive via disposed in the connecting structure.

* * * * *